(12) United States Patent
Sim et al.

(10) Patent No.: US 6,798,709 B2
(45) Date of Patent: Sep. 28, 2004

(54) MEMORY DEVICE HAVING DUAL POWER PORTS AND MEMORY SYSTEM INCLUDING THE SAME

(75) Inventors: Jae-Yoon Sim, Suwon (KR); Dong-Il Seo, Yongin-Shi (KR)

(73) Assignee: Samsung Electronics Co., Ltd., Suwon-si (KR)

(*) Notice: Subject to any disclaimer, the term of this patent is extended or adjusted under 35 U.S.C. 154(b) by 10 days.

(21) Appl. No.: 10/384,630

(22) Filed: Mar. 11, 2003

(65) Prior Publication Data

US 2003/0201673 A1 Oct. 30, 2003

(30) Foreign Application Priority Data

Apr. 25, 2002 (KR) .................. 10-2002-0022682

(51) Int. Cl.[7] .................................................. G11C 7/00
(52) U.S. Cl. .............. 365/226; 365/189.09; 365/189.11
(58) Field of Search .......................... 365/226, 189.09, 365/189.11, 227

(56) References Cited

U.S. PATENT DOCUMENTS 6,320,457 B1    11/2001    Yang
6,574,161 B2 *  6/2003     Ooishi ........................ 365/226

FOREIGN PATENT DOCUMENTS

JP          09-006442          1/1997

\* cited by examiner

Primary Examiner—David Lam
(74) Attorney, Agent, or Firm—Volentine Francos, PLLC

(57) ABSTRACT

A plurality of internal circuits of a memory device are operable at first and second internal voltages, where the first internal voltage is less than the second internal voltage. A first power port of the memory device receives a first power supply voltage, and a second power port of the memory device receives a second power supply voltage, where the first power supply voltage is less than the second power supply voltage. An internal voltage generation circuit of the memory device is selectively operable in either a first mode in which the second internal voltage is generated from the first power supply voltage, or a second mode in which the second internal voltage is generated from the second power supply voltage.

23 Claims, 6 Drawing Sheets

MEMORY DEVICE HAVING DUAL POWER PORTS AND MEMORY SYSTEM INCLUDING THE SAME

BACKGROUND OF THE INVENTION

1. Field of the Invention

The present invention generally relates to memory devices, and more particularly, the present invention relates to memory devices having dual power ports and to memory systems equipped with memory devices having dual power ports.

A claim of priority is made to Korean Patent Application No. 2002-22682, filed on Apr. 25, 2002, the contents of which are incorporated herein by reference.

2. Description of the Related Art

Currently, most memory systems are equipped to receive an externally supplied power voltage, and to convert the externally supplied power voltage into an internal power voltage. The internal power voltage, which may be higher or lower than the externally supplied power voltage, is used as an operational voltage of internal circuits of the memory system.

FIG. 1 is a block diagram illustrating major components parts of a conventional dynamic random access memory (DRAM) system. As shown, a DRAM system 100 includes a DRAM 130, a voltage regulator 110 to which an external power voltage VEXT is supplied, and a memory controller 120. The voltage regulator 110 converts the external power voltage VEXT into a power voltage VCC which is lower than the external power voltage VEXT. For example, the external power voltage VEXT may be 5.0V and the power voltage VCC may be 3.3V. The regulated power voltage VCC is supplied as an operational power voltage to the controller 120 and DRAM 130. The use of a lower-voltage power voltage VCC is primarily intended to reduce power consumption.

In some cases, for example to compensate for a voltage loss caused by a drop in a transistor threshold voltage, it may be necessary for the DRAM 130 to internally generate an internal power voltage VPP which is higher than the power voltage VCC. The internal power voltage VPP voltage may be used in several DRAM circuit components, particularly those constructed with NMOS transistors, such as a word line driver circuit, a bit line isolation circuit in a shared sense amplifier circuit structure, and/or a data output buffer circuit. Specifically, the word line driver circuit may supply the voltage VPP to a word line to allow data be read from or written to a DRAM cell during a read or write operation, without a threshold voltage loss of a transfer transistor of the cell. The bit line isolation circuit may be supplied with the voltage VPP for full HIGH level data transmission between a bit line and a data line. The output buffer may be supplied with the voltage VPP to sufficiently drive an output high voltage (VOH) level.

U.S. Pat. No. 6,320,457 describes circuits having electric charge pumps for generation of the internal power voltage VPP. However, as is generally known, charge pump circuits are generally inefficient and consume large amounts of current. Also, when employing a given charge pump circuit, the pumping current increases with an increase in the target voltage VPP, while pumping efficiency decreases with an increase in the target voltage VPP. Current consumption of the charge pump circuit is often a critical factor in the overall power performance of a memory device, and it is necessary to adopt a charge pump circuit which has appropriate characteristics for a particular memory device.

SUMMARY OF THE INVENTION

According to one aspect of the invention, a plurality of internal circuits of a memory device are operable at first and second internal voltages, where the first internal voltage is less than the second internal voltage. A first power port of the memory device receives a first power supply voltage, and a second power port of the memory device receives a second power supply voltage, where the first power supply voltage is less than the second power supply voltage. An internal voltage generation circuit of the memory device is selectively operable in either a first mode in which the second internal voltage is generated from the first power supply voltage, or a second mode in which the second internal voltage is generated from the second power supply voltage.

According to another aspect of the present invention, a voltage regulator of a memory system generates a first power supply voltage from a second power supply voltage, where the second power supply voltage is greater than the first power supply voltage. A plurality of internal circuits of a memory device of the memory system are operable at first and second internal voltages, where the first internal voltage is less than the second internal voltage. A first power port of the memory device receives the first power supply voltage, and a second power port of the memory device receives the second power supply voltage. An internal voltage generation circuit of the memory device is selectively operable in either a first mode in which the second internal voltage is generated from the first power supply voltage, or a second mode in which the second internal voltage is generated from the second power supply voltage. A control circuit of the memory system controls an operation of the memory device.

According to still another aspect of the present invention, a first voltage regulator of a memory system generates a first power supply voltage from a second power supply voltage, where the second power supply voltage is greater than the first power supply voltage, and a second voltage regulator of the memory system generates a third power supply voltage from the second power supply voltage, where the third power supply voltage is less than the second power supply voltage and greater than the first power supply voltage. A plurality of internal circuits of a memory device of the memory system are operable at first and second internal voltages, where the first internal voltage is less than the second internal voltage. A first power port of the memory device receives the first power supply voltage, and a second power port of the memory device receives the third power supply voltage. An internal voltage generation circuit of the memory device is selectively operable in either a first mode in which the second internal voltage is generated from the first power supply voltage, or a second mode in which the second internal voltage is generated from the third power supply voltage. A control circuit of the memory system controls an operation of the memory device.

BRIEF DESCRIPTION OF THE DRAWINGS

The above and other aspects of the invention will become readily apparent from the detailed description that follows, with reference to the accompanying drawings, in which.

DETAILED DESCRIPTION OF THE PREFERRED EMBODIMENTS

Several non-limiting embodiments of the present invention are described in detail below. Each embodiment is characterized by a memory device which is capable of receiving dual power voltages or by a memory system which includes such a memory device. The dual power voltages are represented, by way of example, as a voltage VCC1 and a voltage VCC2, where VCC2 is higher than VCC1. The voltages VCC1 and VCC2 are selectively used to generate the internal power voltage VPP.

Figure 1:
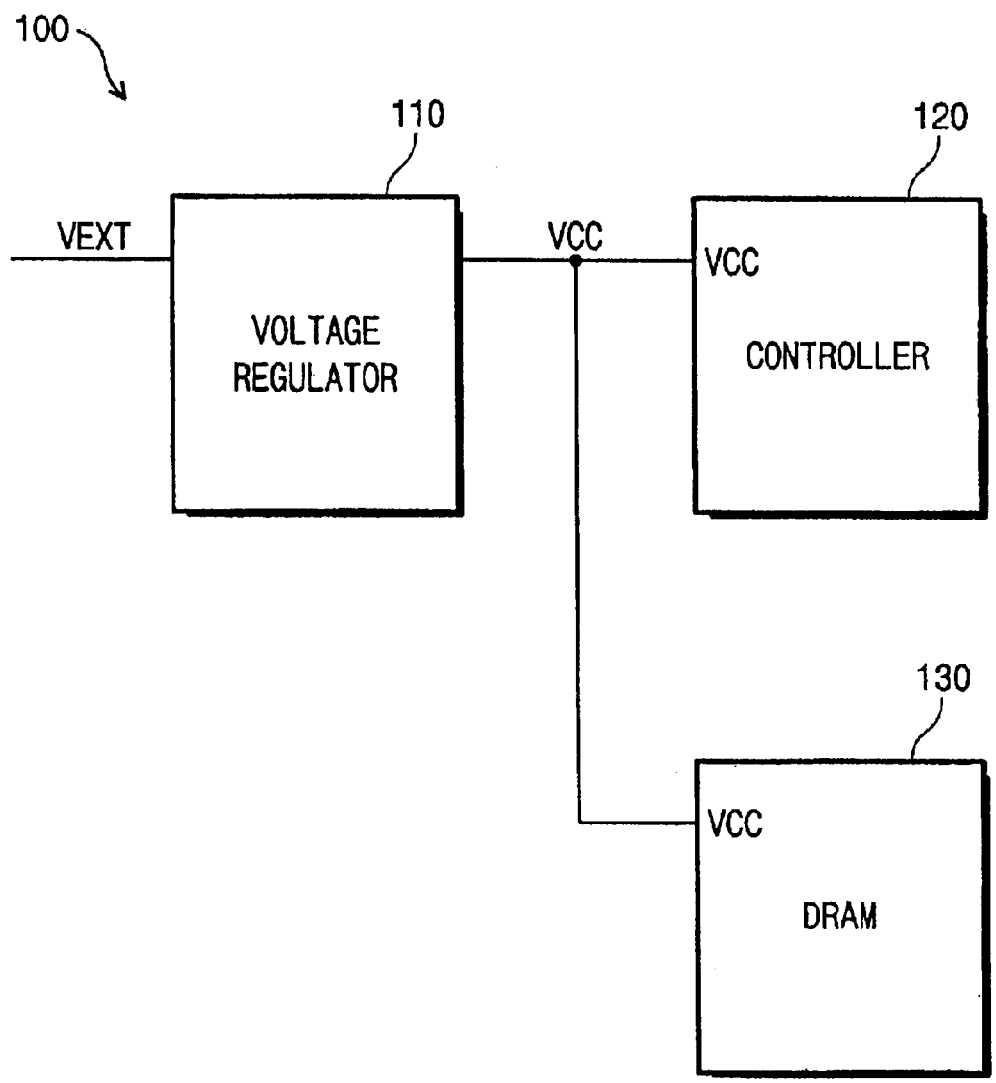
FIG. 1 is a block diagram illustrating a conventional memory system.
Figure 2:
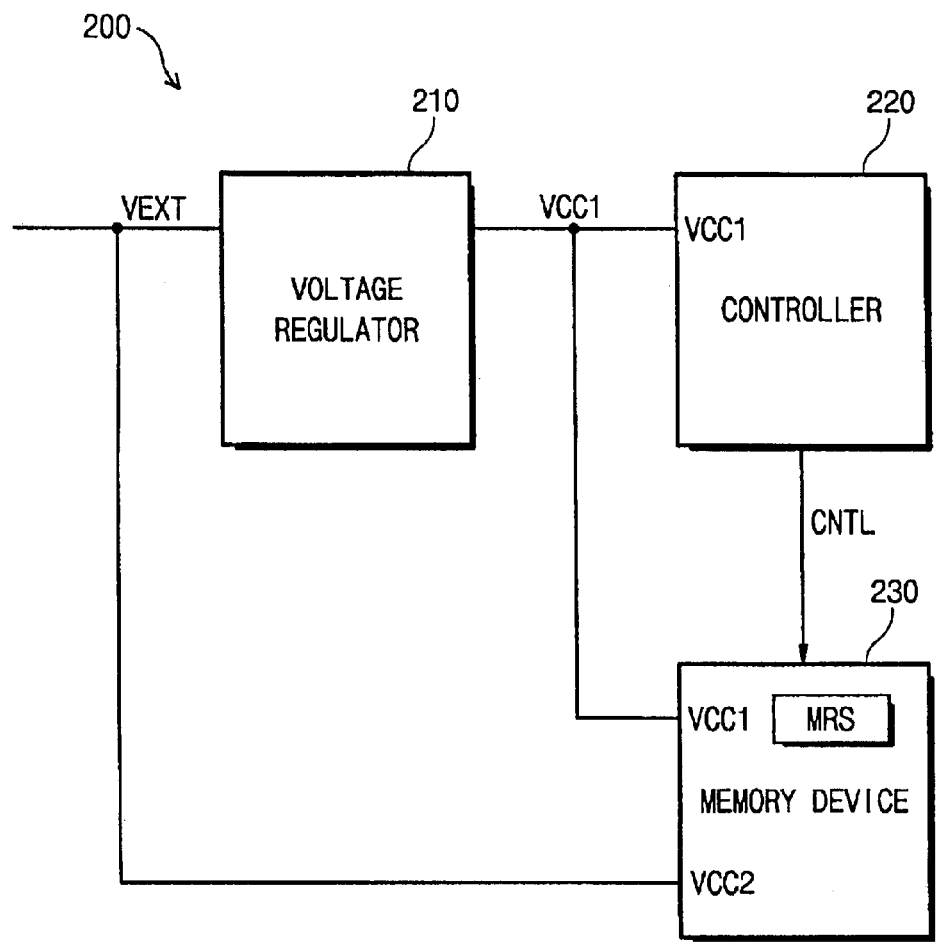
FIG. 2 is a block diagram illustrating a memory system according to an embodiment of the present invention.

FIG. 2 illustrates a memory system 200 according to an embodiment of the present invention. The memory system 200 includes a voltage regulator 210, a controller 220 and a memory device 230. The voltage regulator 210 receives an external power voltage VEXT and outputs a first voltage VCC1. Here, VEXT>VCC1. The first voltage VCC1 is supplied as an operational voltage to the controller 220 which outputs a control signal CNTL to the memory system 200.

The memory device 230 is connected to receive the external voltage VEXT and the first voltage VCC1. In this embodiment, VEXT is the same as a second voltage VCC2. The memory device is made up of a plurality of internal circuits which are operable at first and second internal voltages, VINT and VPP, where VINT is less than VPP. By way of examples, VCC1 is 3.3V, VCC2 is 5.0V, VINT is 2.4V, and VPP is 4.5V.

Since the voltage VCC2 is higher than the voltage VCC1, less power is consumed when generating the second internal voltage VPP from the voltage VCC2. Accordingly, the memory device 230 is selectively operable in either a normal power mode in which the second internal voltage VPP is generated from the first power supply voltage VCC1, or a low power mode in which the second internal voltage VPP is generated from the second power supply voltage VCC2.

Generally, the selection of the normal power mode or the low power mode will depend on whether the external voltage VEXT is directly applied to the VCC2 terminal of the memory device 230. That is, while the memory device 230 may be equipped with the VCC2 terminal, the memory system (module), into which the memory device 230 is plugged, may in some cases not be a type which is configured to supply the VEXT voltage. Thus, the memory device 230 is equipped to operate in either power mode.

One manner of controlling the power mode of the memory device 230 is by use of a control signal CNTL from the controller 220 of the memory system 200. Another way is to rely on information contained in the mode register set MRS of the memory device, which generally contains information as to a configuration of the memory system 200. Yet another way is to detect the presence of the voltage VEXT on the terminal VCC2. If the voltage VEXT is detected at VCC2, a control signal is generated to select the low power mode, and if no voltage is detected at VCC2, a control signal is generated to select the normal power mode.

Figure 3:
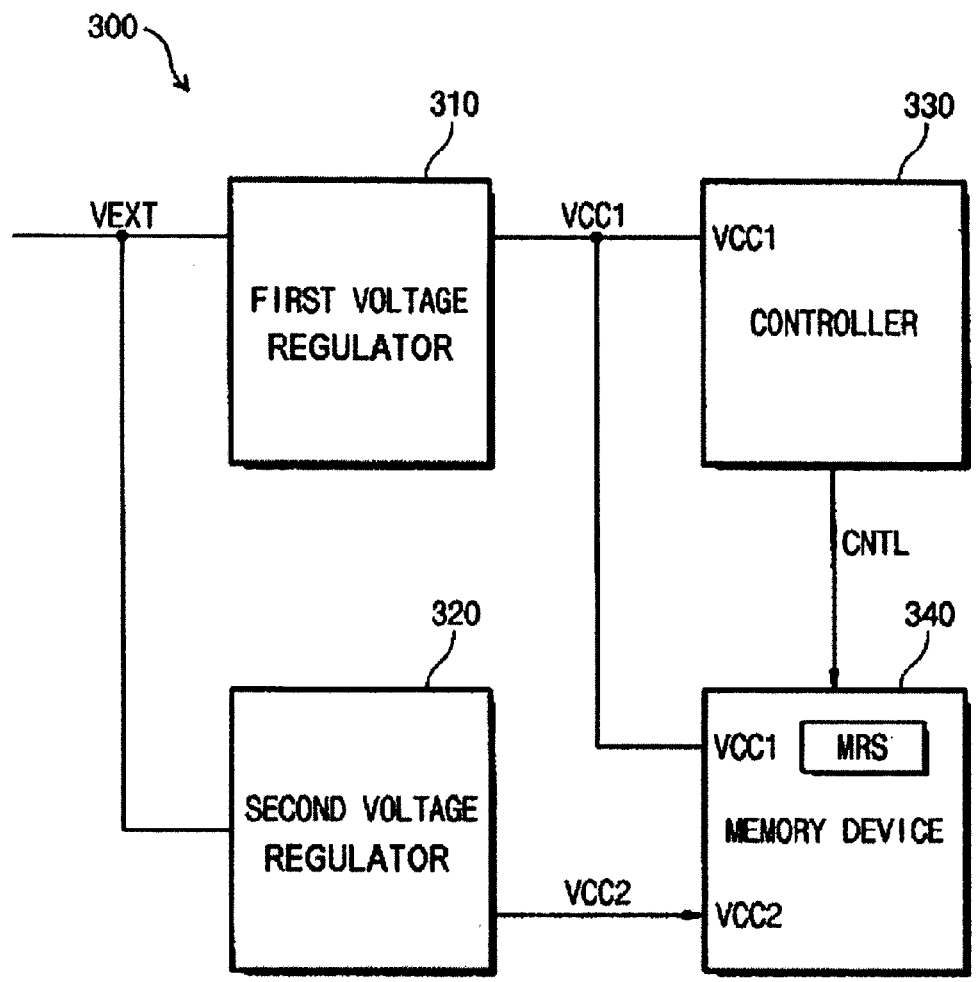
FIG. 3 is a block diagram illustrating a memory system according to another embodiment of the present invention.

FIG. 3 illustrates a memory system 300 according to another embodiment of the present invention. The memory system 300 includes a first voltage regulator 310, a second voltage regulator 320, a controller 330 and a memory device 340. The first voltage regulator 310 receives an external power voltage VEXT and outputs a first voltage VCC1. The second voltage regulator 320 receives the external power voltage VEXT and outputs a second voltage VCC2. Here, VEXT>VCC2>VCC1. The first voltage VCC1 is supplied as an operational voltage to the controller 330 which outputs a control signal CNTL to the memory device 340.

The memory device 340 is connected to receive the first voltage VCC1 and the second voltage VCC2. The memory device is made up of a plurality of internal circuits which are operable at first and second internal voltages, VINT and VPP, where VINT is less than VPP. By way of examples, VEXT is 5.0V, VCC1 is 3.3V, VCC2 is 4.0V, VINT is 2.4V, and VPP is 4.5V. The memory device 340 is selectively operable in either a normal power mode in which the second internal voltage VPP is generated from the first power supply voltage VCC1, or a low power mode in which the second internal voltage VPP is generated from the second power supply voltage VCC2 which is higher than VCC1.

Similar to the first embodiment, the selection of the normal power mode or the low power mode will depend on whether the second voltage VCC2 is applied to the VCC2 terminal of the memory device 340. That is, while the memory device 340 may be equipped with the VCC2 terminal, the memory system (module), into which the memory device 340 is plugged, may in some cases not be of a type which is configured with the second voltage regulator 320. Thus, the memory device 340 is equipped to operate in either power mode.

One manner of controlling the power mode of the memory device 340 is by way of a control signal from the controller 330 of the memory system 300. Another way is to rely on information contained in the mode register set MRS of the memory device, which generally contains information as to a configuration of the memory system 300. Yet another way is to detect the presence of the voltage VCC2 on the terminal VCC2. If the voltage VCC2 is detected at the VCC2 terminal, then the low power mode is selected, and if no voltage is detected at the VCC2 terminal, then the normal power mode is selected.

Figure 4:
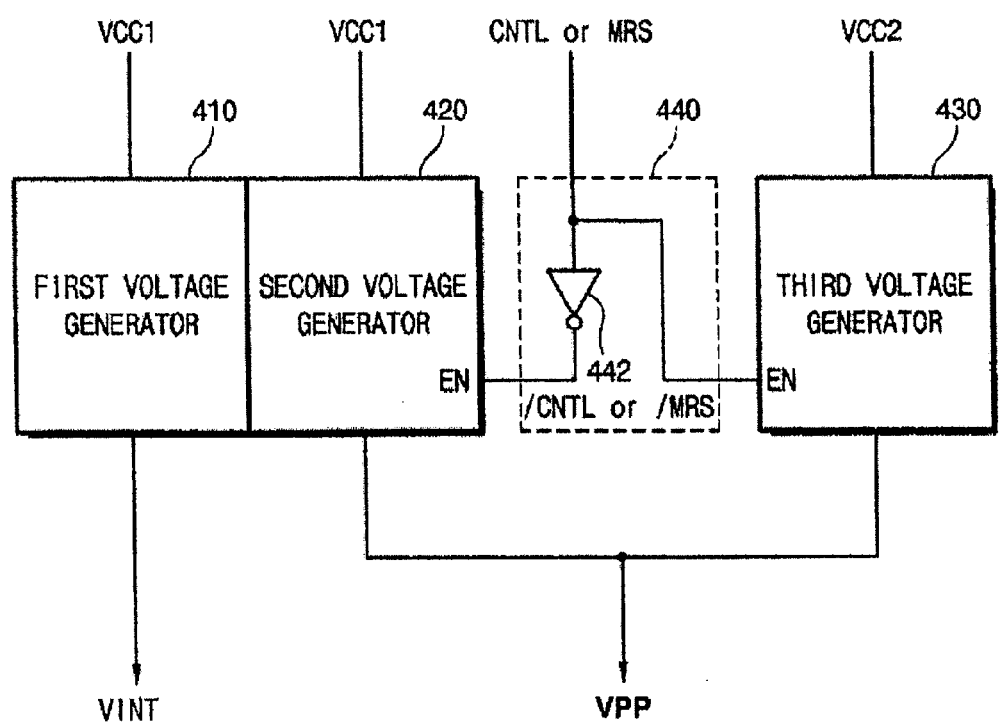
FIG. 4 is a block diagram illustrating a memory device according to an embodiment of the present invention.

FIG. 4 illustrates a memory device having dual power ports according to an embodiment of the present invention. To assist in the understanding of the operation of the memory device, the description below includes a number of exemplary specific voltage values. However, it should be understood that these voltages values are non-limiting examples only.

The memory device 400 of FIG. 4 includes first through third voltage generators 410, 420, 430, and a switching unit 440. The first voltage generator 410 receives a first voltage VCC1 (3.3V), and drops the received voltage to generate a first internal voltage VINT (2.4V). The second voltage generator 420 also receives the first voltage VCC1 (3.3V), and raises the received voltage to generate a second internal voltage VPP (4.5V). The second voltage generator 420 may include a charge pump. The third voltage generator 430 receives a second voltage VCC2 (5.0V), and drops the received voltage to generate the second internal voltage VPP (4.5V).

In the example above, VCC1 (3.3V) is greater than VINT (2.4V), and VCC2 (5.0V) is greater than VPP (4.5V), and therefore the first and third voltage generators 410 and 430 do not require a charge pump operation. However, the second voltage VCC2 may be less than VPP (e.g., VCC2 may be 4.0V), in which case the third voltage generator would be equipped with a charge pump to increase is VCC2 (4.0V) to VPP (4.5V). However, since the voltage increase of 0.5 volts required by the third voltage generator 430 is less than the voltage increase of 1.2 volts required by the second voltage generator 420, the third voltage generator 430 operates much more efficiently than the second voltage generator 420.

The switching unit 440 receives a control signal CNTL from the controller of the memory system or the information contained in a mode register MRS of the memory device, and selectively enables either one of the second voltage generator 420 or the third voltage generator 430. It is noted that the control signal CNTL may instead by derived internally of the memory device upon detecting the presence or absence of the voltage VCC2. In this example, the switching unit 440 includes an inverter connected to receive the control signal CNTL or the mode register signal MRS. The second voltage generator 420 is enabled by the inverted signal CNTL/MRS and the third voltage generator 430 is enabled by the control signal CNTL or the information of the mode register MRS.

In operation, a power mode of the memory device is used to control the generation of the voltage VPP. That is, during a normal power mode, the second voltage generator 420 is enabled to generate the voltage VPP from the voltage VCC1. On the other hand, in a low power mode, the third voltage generator 430 is enabled to generate the voltage VPP from the higher voltage VCC2, thus lowering power consumption.

Figure 5:
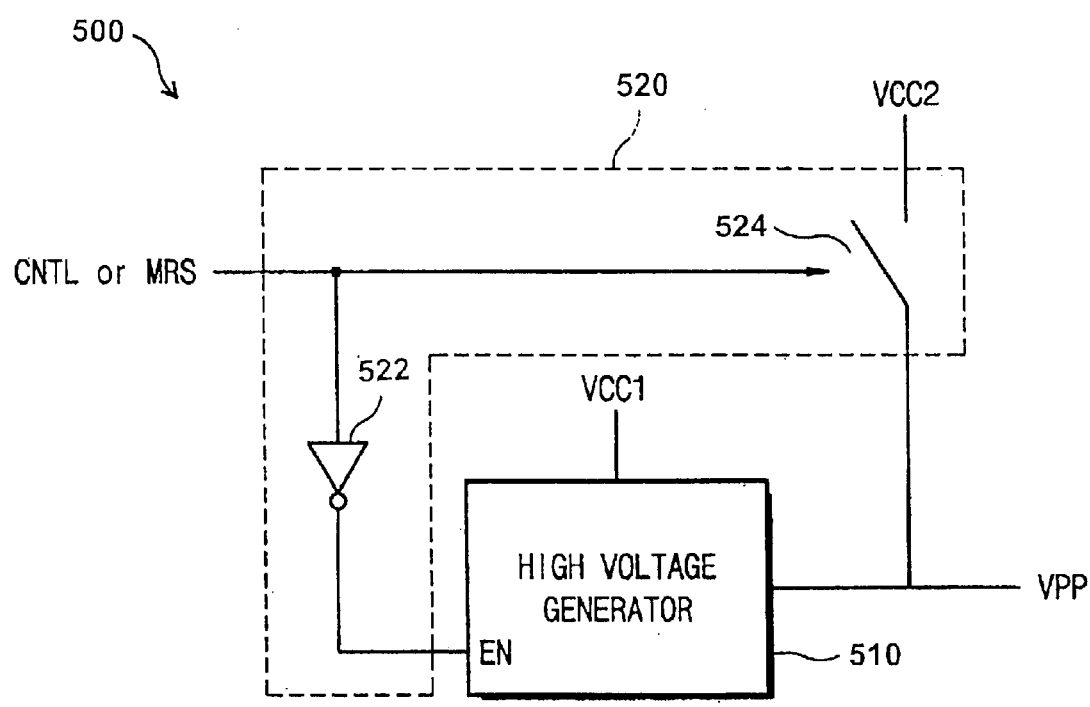
FIG. 5 is a block diagram illustrating a memory device according to another embodiment of the present invention.
Figure 6:
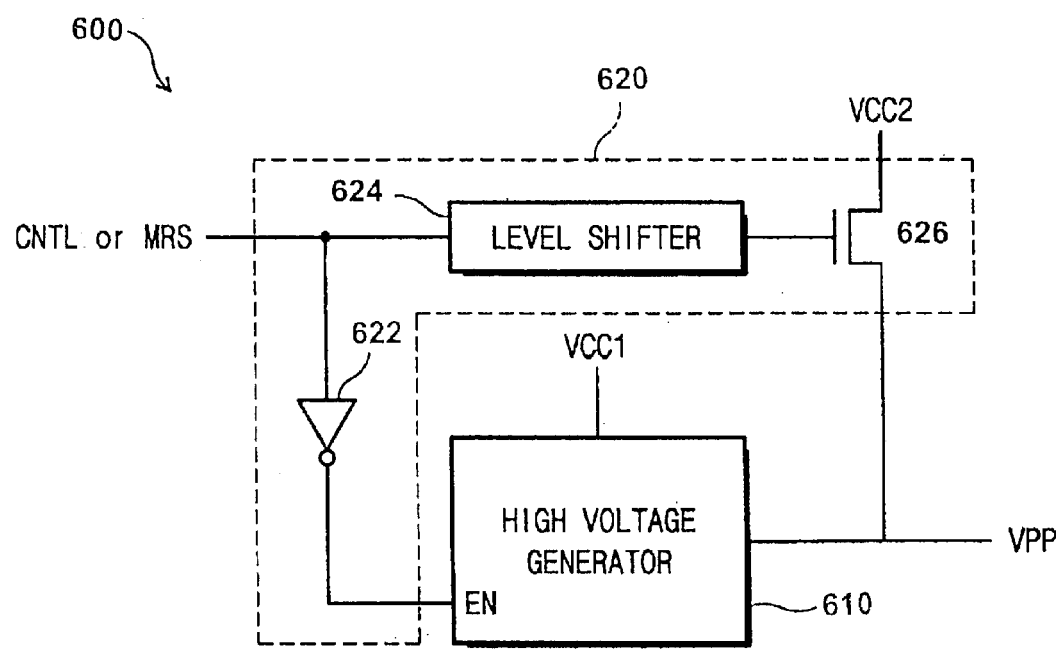
FIG. 6 is a block diagram illustrating a memory device according to still another embodiment of the present invention.

FIGS. 5 and 6 illustrate memory devices having dual power ports according to other embodiments of the present invention. To assist in the understanding of the operation of memory devices, the descriptions below include a number of exemplary specific voltage values. However, it should be understood that these voltages values are non-limiting examples only.

Referring to FIG. 5, the memory device 500 includes a high voltage generator 510 and a switching unit 520. The high voltage generator 510, which includes a charge pump, receives a first voltage VCC1 (3.3V) and generates a high voltage (4.0V) at a VPP terminal. The switching unit 520 includes an inverter 522 which receives a control signal CNTL or a mode register signal MRS, and outputs an enable signal to the high voltage generator 510. The switching unit 520 further includes switch 524 which connects a supplied second voltage VCC2 to the high voltage VPP terminal in response to the control signal CNTL or the mode register signal MRS. The switching unit 520 is thus responsive to the signal CNTL/MRS to generate the high voltage VPP by enabling the high voltage generator 510 or by connecting the VPP terminal to the second voltage VCC2.

Accordingly, in a low power mode, the memory device 500 connects the second voltage VCC2 to the high voltage VPP terminal without operation of the high voltage generator 510. Since the charge pump of the high voltage generator 510 is not operated, power consumption is reduced in the low power mode.

Referring to FIG. 6, a memory device 600 includes a high voltage generator 610 and a switching unit 620. The high voltage generator 610, which includes a charge pump, receives a first voltage VCC1 (3.3V) and generates a high voltage (4V) at a VPP terminal. The switching unit 620 includes an inverter 622 which receives a control signal CNTL or a mode register signal MRS, and outputs an enable signal to the high voltage generator 610. The switching unit 620 further includes transistor 626 which connects a supplied second voltage VCC2 to the high voltage VPP terminal in response to the control signal CNTL or the mode register signal MRS. The switching unit 620 is thus responsive to the signal CNTL/MRS to generate the high voltage VPP by enabling the high voltage generator 610 or by connecting the VPP terminal to the second voltage VCC2. Also, the switching unit 620 primarily differs from that of the embodiment of FIG. 5 in that the switching unit 620 is additional equipped with a level shifter 624. The level shifter 624 receives the control signal CNTL or the mode register signal MRS, and outputs a predetermined voltage level (about VCC2+Vth, where Vth is a threshold voltage of transistor 626). The transistor 626 of switch 620 is turned on in response to the output of the level shifter 624 and the second voltage VCC2 is connected to the high voltage VPP terminal. In this manner, the second voltage VCC2 is transmitted to the high voltage VPP terminal without loss of the threshold voltage (Vth) of the transistor 626.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed is:

1. A memory device, comprising:
   a plurality of internal circuits which are operable at first and second internal voltages, wherein the first internal voltage is less than the second internal voltage;
   a first power port for receiving a first power supply voltage;
   a second power port for receiving a second power supply voltage, wherein the first power supply voltage is less than the second power supply voltage; and
   an internal voltage generation circuit which is selectively operable in either a first mode in which the second internal voltage is generated from the first power supply voltage, or a second mode in which the second internal voltage is generated from the second power supply voltage.

2. The memory device of claim 1, wherein the internal voltage generation circuit is responsive to an externally supplied control signal to select one of the first and second modes.

3. The memory device of claim 1, further comprising a mode register set, wherein the internal voltage generation circuit is responsive to the mode register set to select one of the first and second modes.

4. The memory device of claim 1, wherein the internal voltage generation circuit is responsive to the absence of the second power supply voltage on the second power port to select the first mode, wherein the voltage generation circuit is responsive to the presence of the second power supply voltage on the second power port to select the second mode.

5. The memory device of claim 1, wherein the internal voltage generation circuit comprises:
   a voltage generator circuit which is enabled in the first mode and disabled in the second mode, and which increases the first power supply voltage to the second internal voltage when enabled; and
   a switching circuit which is open in the first mode and closed in the second mode, and which outputs the second power supply voltage as the second internal voltage when closed.

6. The memory device of claim 5, wherein the voltage generator circuit is enabled and disabled, and the switching circuit is opened and closed, in response to an externally supplied control signal.

7. The memory device of claim 5, further comprising a mode register set, wherein the voltage generator circuit is enabled and disabled, and the switching circuit is opened and closed, in response to an output of the mode register set.

8. The memory device of claim 5, wherein the voltage generator circuit is a charge pump.

9. The memory device of claim 6, wherein the switching circuit is comprised of a transistor and a voltage shifter, and wherein the voltage shifter increases a voltage of the externally supplied control signal and applies the increased voltage to a gate of the transistor.

10. The memory device of claim 7, wherein the switching circuit is comprised of a transistor and a voltage shifter, and wherein the voltage shifter increases a voltage of the output of the mode register set and applies the increased voltage to a gate of the transistor.

11. The memory device of claim 5, wherein the internal voltage generation circuit is operable in both the first and second modes to generate the first internal voltage from the first power supply voltage.

12. The memory device of claim 1, wherein the internal voltage generation circuit comprises:
    a first voltage generator circuit which is enabled in the first mode and disabled in the second mode, and which increases the first power supply voltage to the second internal voltage when enabled; and
    a second voltage generator circuit which is enabled in the second mode and disabled in the first mode, and which increases or decreases the second power supply voltage to the second internal voltage when enabled.

13. The memory device of claim 12, wherein the first and second voltage generator circuits are enabled and disabled in response to an externally supplied control signal.

14. The memory device of claim 12, further comprising a mode register set, wherein the first and second voltage generator circuits are enabled and disabled in response to the mode register set.

15. The memory device of claim 12, wherein the first voltage generator circuit is a charge pump.

16. The memory device of claim 15, wherein the second voltage generator is either a down converter or a charge pump.

17. The memory device of claim 12, wherein the internal voltage generation circuit is operable in both the first and second modes to generate the first internal voltage from the first power supply voltage.

18. A memory system comprising:
    a voltage regulator which generates a first power supply voltage from a second power supply voltage, wherein the second power supply voltage is greater than the first power supply voltage;
    a memory device comprising (a) a plurality of internal circuits which are operable at first and second internal voltages, wherein the first internal voltage is less than the second internal voltage, (b) a first power port for receiving the first power supply voltage, (c) a second power port for receiving the second power supply voltage, and (d) an internal voltage generation circuit which is selectively operable in either a first mode in which the second internal voltage is generated from the first power supply voltage, or a second mode in which the second internal voltage is generated from the second power supply voltage; and
    a control circuit which controls an operation of the memory device.

19. The memory system of claim 18, wherein the internal voltage generation circuit is responsive to a control signal supplied from the control circuit to select one of the first and second modes.

20. The memory system of claim 18, wherein the memory device further comprises a mode register set, wherein the internal voltage generation circuit is responsive to the mode register set to select one of the first and second modes.

21. A memory system comprising:
    a first voltage regulator which generates a first power supply voltage from a second power supply voltage, wherein the second power supply voltage is greater than the first power supply voltage;
    a second voltage regulator which generates a third power supply voltage from the second power supply voltage, wherein the third power supply voltage is less than the second power supply voltage and greater than the first power supply voltage;
    a memory device comprising (a) a plurality of internal circuits which are operable at first and second internal voltages, wherein the first internal voltage is less than the second internal voltage, (b) a first power port for receiving the first power supply voltage, (c) a second power port for receiving the third power supply voltage, and (d) an internal voltage generation circuit which is selectively operable in either a first mode in which the second internal voltage is generated from the first power supply voltage, or a second mode in which the second internal voltage is generated from the third power supply voltage; and
    a control circuit which controls an operation of the memory device.

22. The memory system of claim 21, wherein the internal voltage generation circuit is responsive to a control signal supplied from the control circuit to select one of the first and second modes.

23. The memory system of claim 21, wherein the memory device further comprises a mode register set, wherein the internal voltage generation circuit is responsive to the mode register set to select one of the first and second modes.

* * * * *